United States Patent
Miyao et al.

(10) Patent No.: US 11,242,620 B2
(45) Date of Patent: Feb. 8, 2022

(54) POLYCRYSTALLINE SILICON ROD AND METHOD FOR PRODUCING POLYCRYSTALLINE SILICON ROD

(71) Applicant: Shin-Etsu Chemical Co., Ltd., Tokyo (JP)

(72) Inventors: Shuichi Miyao, Niigata (JP); Naruhiro Hoshino, Niigata (JP); Tetsuro Okada, Niigata (JP); Shigeyoshi Netsu, Niigata (JP); Masahiko Ishida, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 501 days.

(21) Appl. No.: 16/026,818

(22) Filed: Jul. 3, 2018

(65) Prior Publication Data
US 2019/0017193 A1    Jan. 17, 2019

(30) Foreign Application Priority Data

Jul. 12, 2017   (JP) .............................. JP2017-136073

(51) Int. Cl.
*C01B 33/035*  (2006.01)
*C30B 35/00*  (2006.01)
(Continued)

(52) U.S. Cl.
CPC .......... *C30B 35/007* (2013.01); *C01B 33/035* (2013.01); *C23C 16/24* (2013.01);
(Continued)

(58) Field of Classification Search
CPC ....... C30B 35/007; C30B 35/00; C30B 29/06; C30B 13/00; C01B 33/035; C01B 33/00;
(Continued)

(56) References Cited

U.S. PATENT DOCUMENTS

2008/0286550 A1   11/2008  Sofin et al.
2014/0004377 A1   1/2014   Kaito
(Continued)

FOREIGN PATENT DOCUMENTS

JP   2008-285403 A   11/2008
JP   2013-193902 A   9/2013
(Continued)

OTHER PUBLICATIONS

Office Action dated Sep. 8, 2020, issued in counterpart JP Application No. 2017-136073, with English translation (5 Pages).
(Continued)

*Primary Examiner* — Smita S Patel
(74) *Attorney, Agent, or Firm* — Westerman, Hattori, Daniels & Adrian, LLP

(57) ABSTRACT

To provide polycrystalline silicon suitable as a raw material for production of single-crystalline silicon. A D/L value is set within the range of less than 0.40 when multiple pairs of silicon cores are placed in a reaction furnace in production of a polycrystalline silicon rod having a diameter of 150 mm or more by deposition according to a chemical vapor deposition process and it is assumed that the average value of the final diameter of the polycrystalline silicon rod is defined as D (mm) and the mutual interval between the multiple pairs of silicon cores is defined as L (mm).

2 Claims, 4 Drawing Sheets

(51) Int. Cl.
*C23C 16/24* (2006.01)
*C30B 29/06* (2006.01)
*C23C 16/44* (2006.01)
*C30B 13/00* (2006.01)

(52) U.S. Cl.
CPC .......... *C23C 16/4418* (2013.01); *C30B 29/06* (2013.01); *C30B 13/00* (2013.01)

(58) Field of Classification Search
CPC ....... C01B 33/02; C01B 33/021; C23C 16/24; C23C 16/46; C23C 16/4418; C23C 16/00
See application file for complete search history.

(56) References Cited

U.S. PATENT DOCUMENTS

| | | |
|---|---|---|
| 2015/0017349 A1 | 1/2015 | Netsu et al. |
| 2015/0107508 A1 | 4/2015 | Ishida et al. |
| 2016/0116423 A1 | 4/2016 | Miyao et al. |
| 2017/0225957 A1* | 8/2017 | Netsu ................... B01J 19/087 |
| 2018/0002180 A1 | 1/2018 | Miyao et al. |
| 2018/0244527 A1 | 8/2018 | Miyao et al. |

FOREIGN PATENT DOCUMENTS

| | | | | |
|---|---|---|---|---|
| JP | 2014-28747 A | | 2/2014 | |
| JP | 2014-522799 A | | 9/2014 | |
| JP | 2015-3844 A | | 1/2015 | |
| JP | WO2016035249 | * | 3/2016 | ........... C01D 33/035 |
| JP | 2016052970 A | | 4/2016 | |
| JP | 2016-150885 A | | 8/2016 | |
| WO | 2013/006522 A1 | | 1/2013 | |
| WO | 2013/125207 A1 | | 8/2013 | |
| WO | 2017047259 A1 | | 3/2017 | |

OTHER PUBLICATIONS

Office Action dated Mar. 30, 2021, issued in counterpart JP application No. 2017-136073, with English translation. (4 pages).

* cited by examiner

POLYCRYSTALLINE SILICON ROD AND METHOD FOR PRODUCING POLYCRYSTALLINE SILICON ROD

BACKGROUND OF THE INVENTION

Field of the Invention

The present invention relates to a crystal growth technique of a polycrystalline silicon rod, and more specifically relates to a technique for producing a polycrystalline silicon rod suitable as a raw material for production of single-crystalline silicon.

Description of the Related Art

Single-crystalline silicon essential for manufacturing a semiconductor device and the like is grown as a crystal according to a CZ method or an FZ method, and a polycrystalline silicon rod or a polycrystalline silicon mass is used as a raw material in such a case. Such a polycrystalline silicon material is often produced according to a Siemens method. The Siemens method is a method including bringing a silane raw material gas of trichlorosilane, monosilane or the like into contact with a silicon core heated, thereby growing polycrystalline silicon on the surface of the silicon core by vapor-phase epitaxy (deposition) according to a CVD (Chemical Vapor Deposition) process.

For example, when single-crystalline silicon is grown as a crystal according to a CZ method, a polycrystalline silicon mass is charged in a quartz crucible, and heated and molten to provide a silicon melt, a seed crystal is dipped in the silicon melt to allow a dislocation line to disappear for no dislocation, and thereafter a crystal is pulled up while the diameter thereof is gradually increased until a predetermined diameter is achieved. If unmolten polycrystalline silicon here remains in the silicon melt, such an unmolten polycrystalline piece drifts in the vicinity of the solid-liquid interface by convection, thereby causing the occurrence of dislocation to be induced, to result in disappearance of a crystal line.

Japanese Patent Laid-Open No. 2008-285403 reports the following: a needle crystal may be deposited in a polycrystalline silicon rod in a step of producing the rod according to a Siemens method, and, if such a polycrystalline silicon rod is used to grow single-crystalline silicon according to a FZ method, an individual crystallite is not uniformly molten depending on the size thereof due to the above-described heterogeneous fine structure, and an unmolten crystallite as a solid particle passes through a molten zone into a single-crystalline rod and is thus incorporated as an unmolten particle into the solidified surface of a single crystal, thereby resulting in the occurrence of defect formation. See also Japanese Patent Laid-Open No. 2012-193902 and Japanese Patent Laid-Open No. 2014-028747, with respect to the needle crystal.

The "needle crystal" referred herein means a needle crystal whose long axis direction corresponds to the deposition direction of the polycrystalline silicon rod (direction vertical to the long axis direction of the polycrystalline silicon rod). The length in the long axis direction of the needle crystal is up to about several nm. Such a needle crystal is considered to be formed by integration due to interconnection of a locally heterogeneous crystal generated in the course of deposition of polycrystalline silicon, with progression of a deposition step. If a polycrystalline silicon rod in which such locally heterogeneous crystal and needle crystal are present is used to perform crystal growth of single-crystalline silicon according to an FZ method, the locally heterogeneous crystal and the needle crystal float in the silicon melt, resulting in failure of crystal growth. Therefore, there is demanded a growth technique of a polycrystalline silicon rod including no locally heterogeneous crystal and no needle crystal. In comparison of Miller indices, a needle crystal crystallographically has a feature where <220> is dominant over <111> (the amount of detection is larger in a <220> in comparison of the amount of detection by X-ray diffraction.), and <111> is dominant in a region where no needle crystal is present.

Japanese Patent Laid-Open No. 2016-150885 reports the following: a locally heterogeneous crystal having a principal plane of <111> is easily generated at the center portion of a polycrystalline silicon rod (portion closer to a core). If the crystal grain size is measured by EBSD, there cannot be obtained any information on heterogeneity of a locally heterogeneous crystal, while even the crystal orientation forming the heterogeneous crystal, besides the outer appearance of the heterogeneous crystal, is determined. The best method for detecting a locally heterogeneous crystal is a method where etching by an aqueous solution of hydrofluoric acid and nitric acid mixed is performed and observation with an optical microscope is made. In observation at a magnification of about 100 times with an optical microscope, a locally heterogeneous crystal can be often confirmed as a crystal portion having a longer diameter of 10 μm or more.

SUMMARY OF THE INVENTION

Of course, single-crystalline silicon grown in either case of a CS method or an FZ method is increased in the diameter thereof, and the diameter thereof is currently predominantly from 6 inches to 8 inches. According to such an increase in the diameter, adverse effects (disappearance of a crystal line, warpage or disorder of a crystal line, and the like) caused by a heterogeneous site present in a polycrystal have been remarkably generated in the step of single-crystallization. Therefore, polycrystalline silicon for use as a raw material for production has been increasingly demanded to have higher crystal homogeneity than ever. Specifically, such polycrystalline silicon is demanded to include neither a needle crystal nor a locally heterogeneous crystal.

The present invention has been made in view of such problems, and an object thereof is to provide polycrystalline silicon suitable as a raw material for production of single-crystalline silicon, resulting in contribution to stable production of single-crystalline silicon.

In order to achieve the object, the polycrystalline silicon rod according to the present invention is a polycrystalline silicon rod grown by deposition according to a chemical vapor deposition process, wherein the polycrystalline silicon rod does not include any needle crystal having a shape where a grain size $d_v$ in a direction vertical to a long axis direction of the polycrystalline silicon rod is larger than a grain size $d_p$ in a direction in parallel with the long axis direction of the polycrystalline silicon rod ($d_v > d_p$).

In addition, the polycrystalline silicon rod according to the present invention is a polycrystalline silicon rod grown by deposition according to a chemical vapor deposition process, wherein, when a surface of a plate-like sample collected so that a direction vertical to a long axis direction of the polycrystalline silicon rod corresponds to a principal plane direction is etched by a mixed liquid of hydrofluoric acid and nitric acid, the etched surface does not include any locally heterogeneous crystal having a grain size of 10 μm or more.

In addition, the polycrystalline silicon rod according to the present invention is a polycrystalline silicon rod grown by deposition according to a chemical vapor deposition process, wherein the polycrystalline silicon rod has a diameter (2R) of 150 mm or more, and, when an X-ray diffraction chart obtained by in-plane rotation with a center of a plate-like sample collected from each of a center region, an R/2 region and an outer region of the polycrystalline silicon rod, as a center of rotation, at an angle φ of 180 degrees is determined, a degree of variation in diffraction intensity from a <220> plane satisfies 0.15 or less in the center region, 0.30 or less in the R/2 region and 0.58 or less in the outer region in evaluation as a $6\sigma_{n-1}$/average value, wherein $\sigma_{n-1}$ represents a standard deviation.

Preferably, the degree of variation in diffraction intensity from the <220> plane satisfies 0.12 or less in the center region, 0.30 or less in the R/2 region and 0.54 or less in the outer region.

More preferably, the degree of variation in diffraction intensity from the <220> plane satisfies 0.09 or less in the center region, 0.15 or less in the R/2 region and 0.20 or less in the outer region.

Further preferably, the degree of variation in diffraction intensity from the <220> plane satisfies 0.08 or less in the center region, 0.10 or less in the R/2 region and 0.10 or less in the outer region.

In addition, the method for producing a polycrystalline silicon rod according to the present invention is a method for producing a polycrystalline silicon rod having a diameter of 150 mm or more by deposition according to a chemical vapor deposition process, wherein a D/L value is set within the range of less than 0.40 when multiple pairs of silicon cores are placed in a reaction furnace and it is assumed that an average value of a final diameter of the polycrystalline silicon rod is defined as D (mm) and a mutual interval between the multiple pairs of silicon cores is defined as L (mm).

Preferably, a reaction pressure in a deposition step of polycrystalline silicon is set to 0.2 MPa or more.

The polycrystalline silicon rod according to the present invention can be used to perform crystal growth according to an FZ method and/or crystal growth by use of a mass obtained from a polycrystalline silicon block according to a CZ method, thereby allowing local generation of a partial melt residue to be suppressed, to result in contribution to stable production of single-crystalline silicon.

DETAILED DESCRIPTION OF THE PREFERRED EMBODIMENTS

Figure 1A:
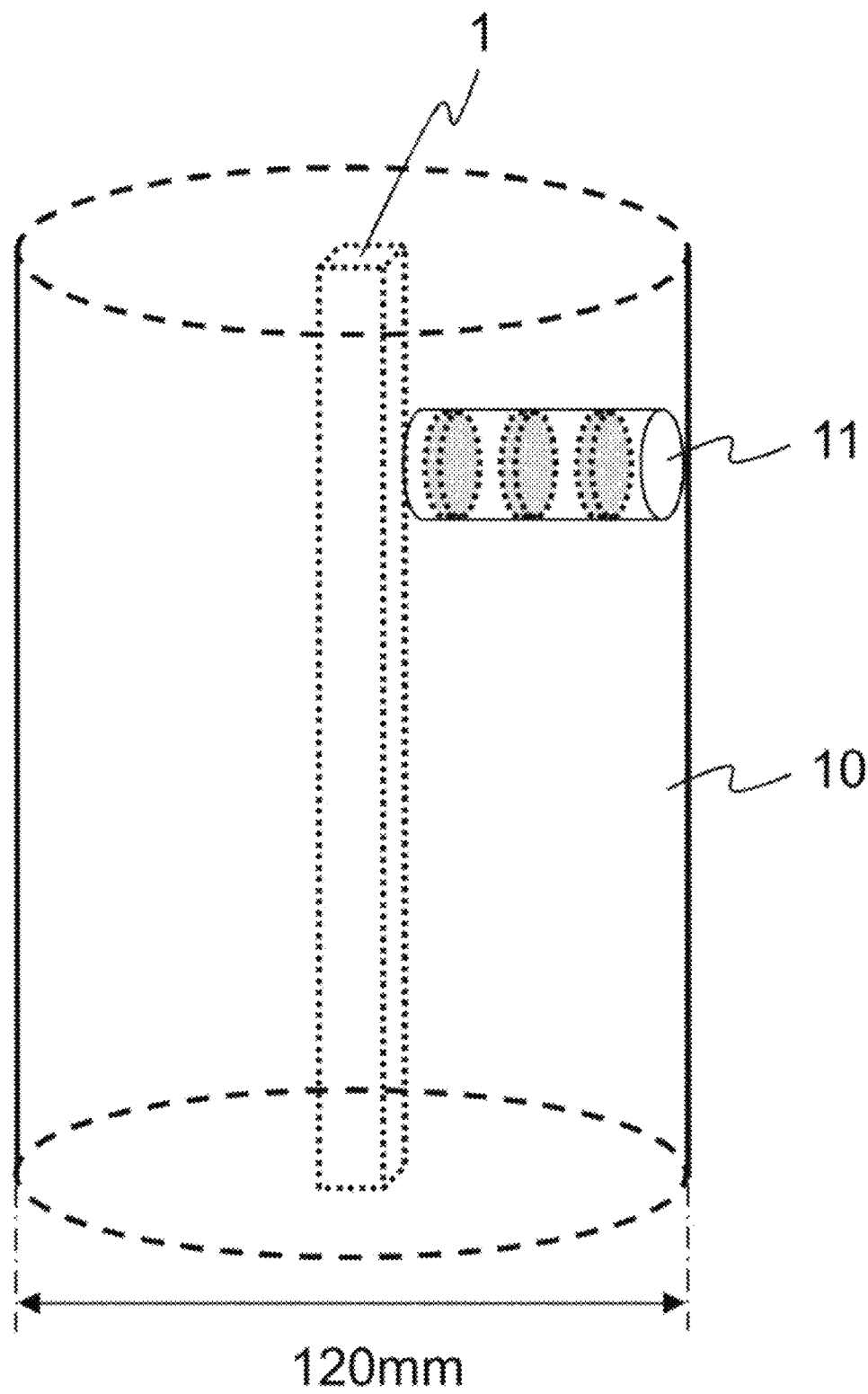
FIG. 1A illustrates a view for description of a collection example of a plate-like sample for X-ray diffraction profile measurement, from a polycrystallinee silicon rod deposited and grown according to a chemical vapor deposition process.

Hereinafter, embodiments of the present invention are described with reference to the drawings.

The present inventors have proposed, in Japanese Patent Laid-Open No. 2015-3844, an invention relating to a method for selecting a polycrystalline silicon rod for use as a raw material for production of single-crystalline silicon according to an X-ray diffraction method in view of the current state where there is demanded an advanced technique for selecting polycrystalline silicon suitable as a raw material for production of single-crystalline silicon at high quantitativity and reproducibility for the purpose of stable production of single-crystalline silicon at a high yield, and the invention is registered as Japanese Patent No. 5947248.

The method is to select a polycrystalline silicon rod as a raw material for production of single-crystalline silicon in the following case: a polycrystalline silicon rod grown by deposition according to a chemical vapor deposition process is used to collect a plate-like sample in which the cross section perpendicular to the radial direction corresponds to a principal plane, the plate-like sample is placed at a position where the Bragg reflection from a first Miller index plane <111> is detected, in-plane rotation is made at a rotation angle φ with the center of the plate-like sample as the center of rotation so that φ scanning of the principal plane of the plate-like sample is made with an X-ray irradiation region defined by a slit, a chart is determined which represents the dependence of the Bragg reflection intensity from the Miller index plane on the rotation angle (φ) of the plate-like sample, the diffraction intensity value ($I_B^{<111>}$) of a baseline is determined from the chart, furthermore the diffraction intensity value ($I_B^{<220>}$) of a baseline is determined from a φ scanning chart obtained from a second Miller index plane <220> in the same manner, and a magnitude relationship between the $I_B^{<111>}$ value and the $I_B^{<220>}$ value simultaneously satisfies the following two conditions.

Such two conditions are as follows: condition 1: "the $I_B^{<111>}$ and $I_B^{<220>}$ obtained with respect to the plate-like sample collected at a position located in the range of R/3 or less from the center in the radial direction of the polycrystalline silicon rod having a radius R satisfy $I_B^{<111>} > I_B^{<220>}$"; and condition 2: "the $I_B^{<111>}$ value and $I_B^{<220>}$ value obtained with respect, to the plate-like sample collected at a position located in the range of 2R/3 or more and 3R/3 or less from the center in the radial direction of the polycrystallinee silicon rod having a radius R satisfy $I_B^{<111>} < I_B^{<220>}$".

As a locally heterogeneous crystal having a Miller index plane <111> as a principal plane is more included, a diffraction peak due to a Miller index plane <111>, higher in the intensity than the intensity of a baseline, is more observed in the above φ scanning chart. Similarly, as a needle crystal and a locally heterogeneous crystal having a Miller index plane <220> as a principal plane are more included, a diffraction peak due to a Miller index plane <220>, higher in the intensity than the intensity of a baseline, is more observed in the above φ scanning chart. The presence of such diffraction peaks can be then evaluated as the variation in diffraction intensity of each of Miller index planes <111> and <220>, which can be evaluated from the φ scanning chart. Accordingly, such a variation in diffraction intensity, if can be quantitatively evaluated, can be used as an index of the degree of incorporation of each of a needle crystal and a locally heterogeneous crystal having Miller index planes <111> and <220> as principal planes.

According to studies made by the present inventors, it has been found that, the variation in diffraction intensity of a Miller index plane <111> is easily generated at a site where the load due to current heating in deposition of polycrystalline silicon is increased (mainly the vicinity of a silicon core) and the variation in diffraction intensity of a Miller index plane <220> is easily generated at a site where radiation heat from an adjacent polycrystalline silicon rod is received (mainly the outside of a polycrystalline silicon rod).

It has been already reported by the present inventors (Japanese Patent Laid-Open No. 2016-150885) that a locally heterogeneous crystal having a principal plane <111> is easily generated at the center portion of a polycrystalline silicon rod, and the variation in diffraction intensity of a Miller index plane <111> can be suppressed by proper control of the temperature setting of the center portion of a polycrystalline silicon rod.

On the contrary, a locally heterogeneous crystal having a principal plane <220> is easily generated at a site where radiation heat from an adjacent polycrystalline silicon rod is received (mainly the outside of a polycrystalline silicon rod), and therefore radiation heat from an adjacent polycrystalline silicon rod is demanded to be considered.

The present inventors have made studies about the problem of radiation heat, and thus have found that a needle crystal and a locally heterogeneous crystal having a principal plane <220> can be effectively inhibited from being generated by a D/L value which is set within the range of less than 0.40 when multiple pairs of silicon cores are placed in a reaction furnace in production of a polycrystalline silicon rod having a diameter of 150 mm or more according to a chemical vapor deposition process and it is assumed that the average value of the final diameter of a polycrystalline silicon rod is defined as D (mm) and the mutual interval between the multiple pairs of silicon cores is defined as L (mm).

Specifically, the above method can provide a polycrystalline silicon rod grown by deposition according to a chemical vapor deposition process, wherein the polycrystalline silicon rod has a diameter (2R) of 150 mm or more, and, when an X-ray diffraction chart obtained by in-plane rotation with the center of a plate-like sample collected from each of the center region, the R/2 region and the outer region of the polycrystalline silicon rod, as the center of rotation, at an angle φ of 180 degrees is determined, the degree of variation in diffraction intensity from a <220> plane satisfies 0.15 or less in the center region, 0.30 or less in the R/2 region and 0.58 or less in the outer region in evaluation as a $6\sigma_{n-1}$/average value. Such evaluation here is made with the $6\sigma_{n-1}$/average value as the degree of variation in diffraction intensity of a Miller index plane <220> (the degree of variation in diffraction intensity from a <220> plane), and $\sigma_{n-1}$ represents the standard deviation.

In the present invention, the degree of crystal homogeneity is thus evaluated in terms of the degree of variation in diffraction intensity of a Miller index plane <202>. Hereinafter, the evaluation procedure is described.

[Collection of Evaluation Sample]

Figure 1B:
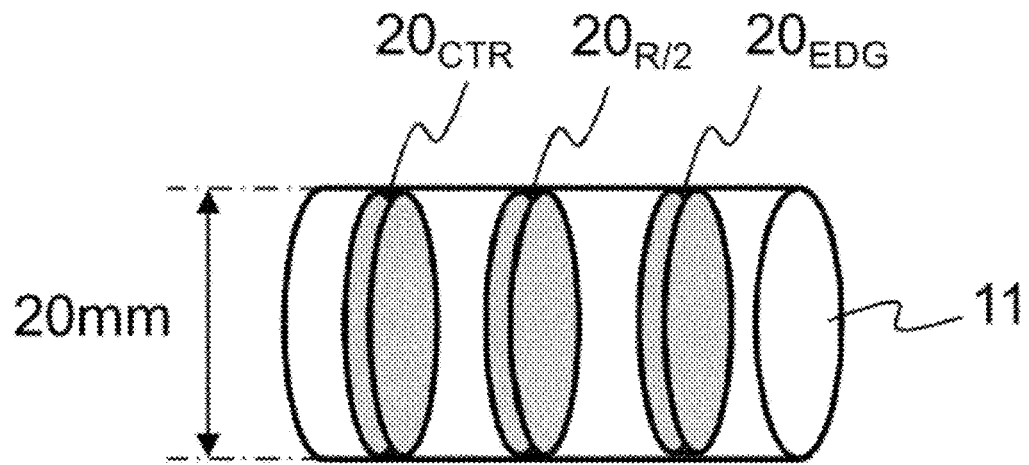
FIG. 1B illustrates a view for description of a collection example of a plate-like sample for X-ray diffraction profile measurement, from a polycrystalline silicon rod deposited and grown according to a chemical vapor deposition process.

FIG. 1A and FIG. 1B each illustrate a view for description of a collection example of a plate-like sample 20 for X-ray diffraction profile measurement, from a polycrystalline silicon rod 10 deposited and grown according to a chemical vapor deposition process such as a Siemens method. In the drawings, symbol 1 represents a silicon core for use in deposition of polycrystallinee silicon on the surface and thus production of a silicon rod. In the example, the plate-like sample 20 is collected from each of three sites (CTR: a site closer to the silicon core 1, EDG: a site closer to the outer side surface of the polycrystalline silicon rod 10, R/2: site between CTR and EGD) in order to evaluate crystal homogeneity. In the example illustrated in the drawings, the plate-like sample 20 is collected by hollowing out in a direction vertical to the long axis direction of the polycrystalline silicon rod 10.

The diameter of the polycrystalline silicon rod 10 illustrated in FIG. 1A is 150 mm or more, and a rod 11 having a substantial diameter of 20 mm and a substantial length of 70 mm is obtained by hollowing out from the outer side surface of the polycrystalline silicon rod 10 in a direction vertical to the longitudinal direction of the silicon core 1.

As illustrated in FIG. 1B, plate-like samples ($20_{CTR}$, $20_{EDG}$, $20_{R/2}$) each having a cross section perpendicular to the radial direction of the polycrystalline silicon rod 10 as a principal plane and having a substantial thickness of 2 mm are collected from the site (CTR) closer to the silicon core 1 of the rod 11, the site (EDG) closer to the side surface of the polycrystalline silicon rod 10 and the site (R/2) between CTR and EGD, respectively.

The site, the length and the number of samples, with respect to collection of the rod 11, may be appropriately determined depending on the diameter of the silicon rod 10 and the diameter of the rod 11 obtained by hollowing out, and the plate-like sample 20 may also be collected from any site of the rod 11 obtained by hollowing out, but such a site preferably corresponds to one which enables properties of the entire silicon rod 10 to be reasonably presumed.

A case where the diameter of the plate-like sample 20 is substantially 20 mm is merely an example, and the diameter may be properly defined as long as X-ray diffraction measurement is not impaired. In order to perform crystalline texture observation with an optical microscope, the surface of the plate-like sample 20 may be subjected to lap polishing and then etching by a mixed liquid of hydrofluoric acid and nitric acid.

[X-Ray Diffraction Chart]

Figure 2:
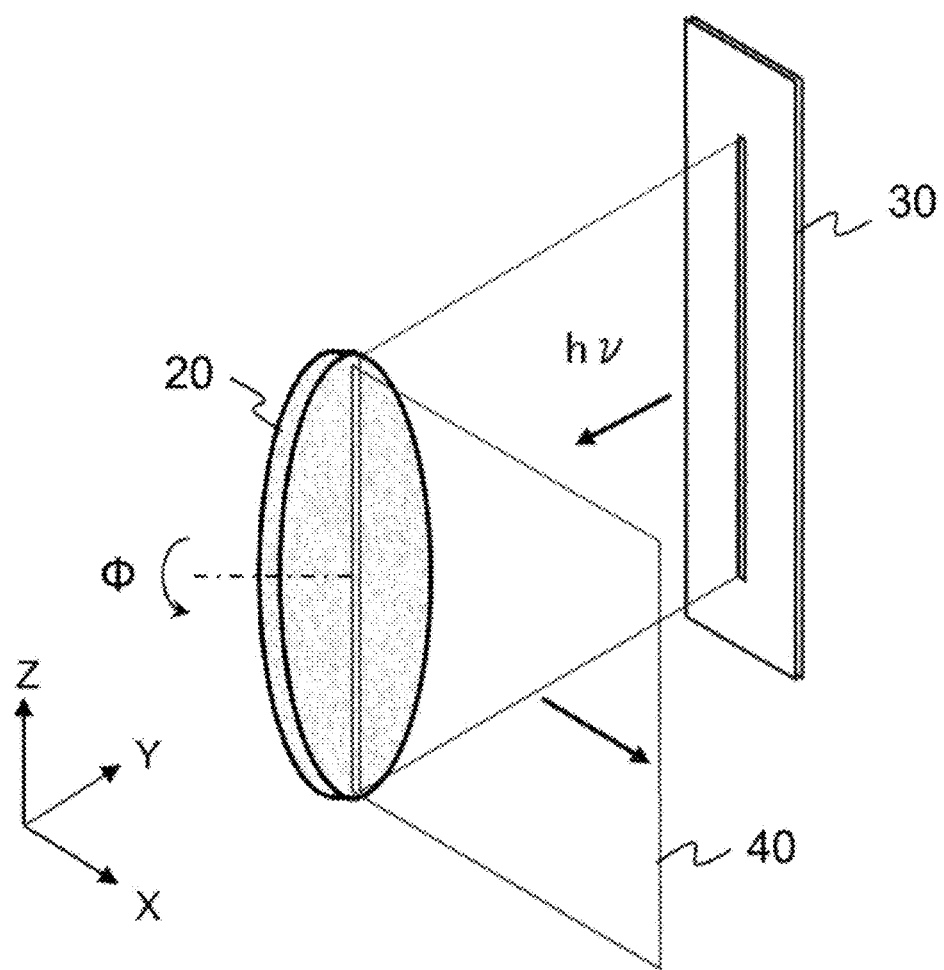
FIG. 2 illustrates a view for description of an outline of a measurement system example in determination of an X-ray diffraction profile from a plate-like sample according to a φ scanning method.

FIG. 2 illustrates a view for schematically describing a measurement system example in determination of the X-ray diffraction profile from the plate-like sample 20 according to a φ scanning method, and, in the example illustrated in the drawing, an elongated rectangular region defined by a slit in a region over both peripheral ends of the plate-like sample 20 is irradiated with X-ray, and in-YZ-plane rotation (φ=0° to 180°) is made with the center of the plate-like sample 20 as the center of rotation so that scanning of the entire surface of the plate-like sample 20 is made with the region irradiated with X-ray. The plate-like sample 20 is set at an angle which allows the diffraction intensity of a <220> plane to be obtained. X-Ray beam 40 (Cu-Kα ray: wavelength: 1.54 Å) ejected through a slit 30 and collimated enters the plate-like sample 20, and the intensity of the X-ray beam diffracted with respect to each sample rotation angle (θ) is detected by a detector (not illustrated) with rotation of the plate-like sample 20 in a YZ plane (φ scanning measurement), to provide an X-ray diffraction chart (φ scanning chart).

Figure 3A:
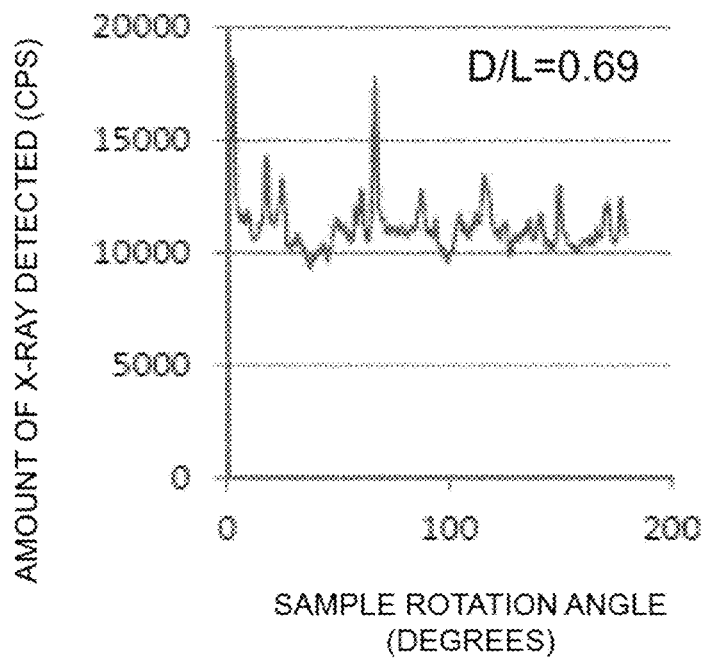
FIG. 3A represents an X-ray diffraction chart obtained from a <220> plane of a plate-like sample collected from a polycrystalline silicon rod grown under a condition of a D/L value of 0.69.
Figure 3B:
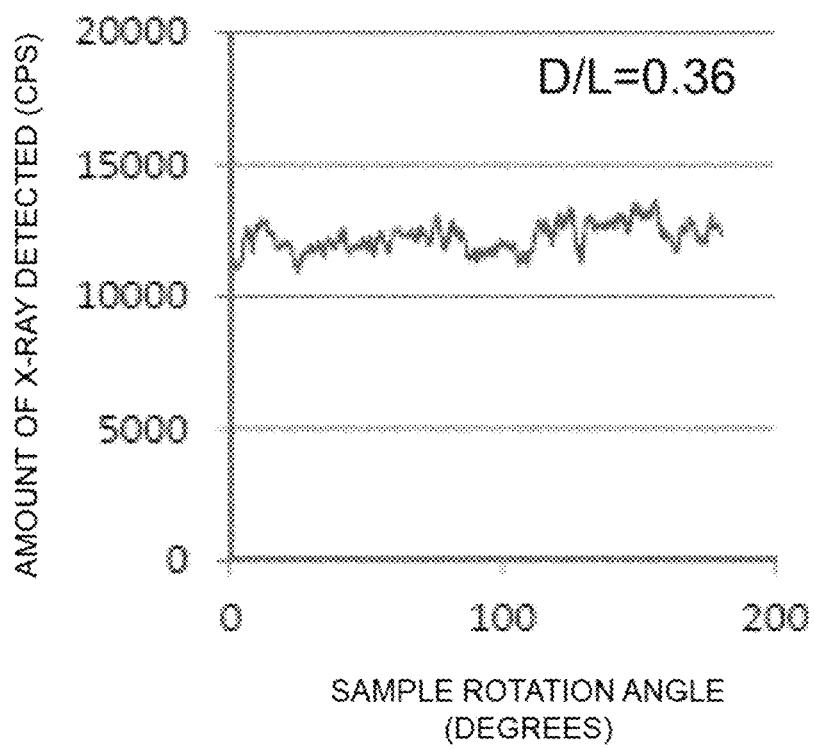
FIG. 3B represents an X-ray diffraction chart obtained from a <220> plane of a plate-like sample collected from a polycrystalline silicon rod grown under a condition of a D/L value of 0.36.

FIG. 3A and FIG. 3B each illustrate an example of the X-ray diffraction chart obtained according to the above procedure, and FIG. 3A illustrates an X-ray diffraction chart, obtained from a <220> plane of a plate-like sample collected from a polycrystalline silicon rod grown under a condition of a D/L value of 0.69, and FIG. 3B illustrates an X-ray diffraction chart obtained from a <220> plane of a plate-like sample collected from a polycrystalline silicon rod grown under a condition of a D/L value of 0.36, when multiple pairs of silicon cores are placed in a reaction furnace and it is assumed that the average value of the final diameter of the polycrystalline silicon rod is defined as D (mm) and the mutual interval between the multiple pairs of silicon cores is defined as L (mm).

In the X-ray diffraction chart in FIG. 3A, there are observed a large number of diffraction peaks from a Miller index plane <220>, higher in the intensity than the intensity of a baseline. On the contrary, in the X-ray diffraction chart in FIG. 3B, there are not observed any diffraction peaks from a Miller index plane <220>, higher in the intensity than the intensity of a baseline. The results indicate that, while the plate-like sample collected from a polycrystalline silicon rod grown under a condition of a D/L value of 0.69 includes a needle crystal and a locally heterogeneous crystal having a Miller index plane <220> as a principal plane in large numbers, the plate-like sample collected from a polycrystalline silicon rod grown under a condition of a D/L value of 0.36 hardly includes a needle crystal and a locally heterogeneous crystal having a Miller index plane <220> as a principal plane.

Figure 4A:
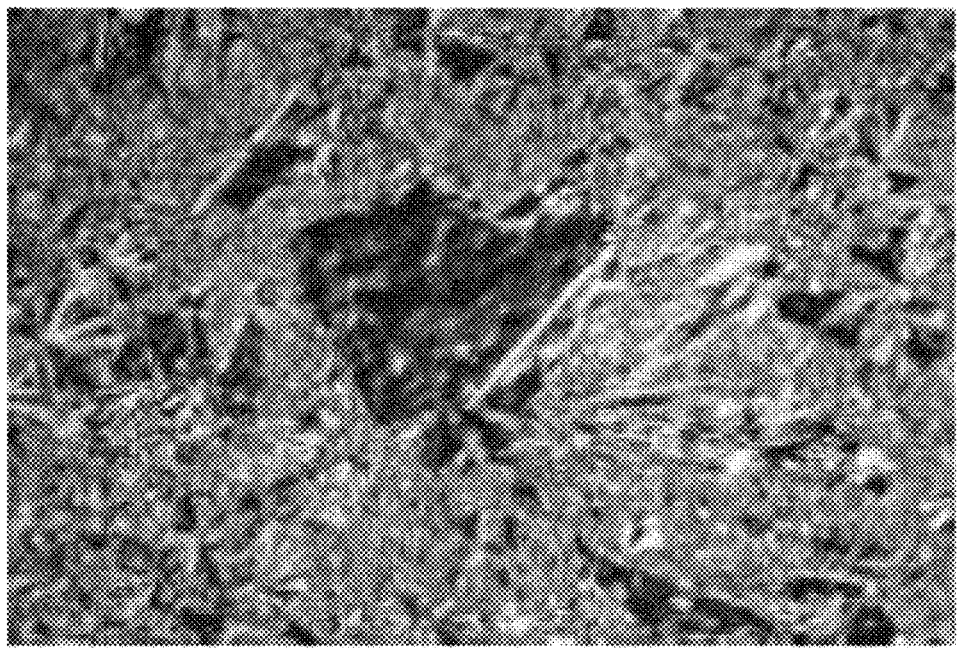
FIG. 4A represents the result of optical microscope observation of the surface of the plate-like sample represented in FIG. 3A, etched by a mixed liquid of hydrofluoric acid and nitric acid.
Figure 4B:
FIG. 4B represents the result of optical microscope observation of the surface of the plate-like sample represented in FIG. 3B, etched by a mixed liquid of hydrofluoric acid and nitric acid.

FIG. 4A and FIG. 4B represents the results of optical microscope observation of the surfaces of such plate-like samples, etched by a mixed liquid of hydrofluoric acid and nitric acid. While a needle crystal and a locally heterogeneous crystal are observed in large numbers in the plate-like sample collected from a polycrystalline silicon rod grown under a condition of a D/L value of 0.69 (FIG. 4A), such any heterogeneous portion is not observed in the plate-like sample collected from a polycrystalline silicon rod grown under a condition, of a B/L value of 0.36 (FIG. 4B).

EXAMPLES

Multiple pairs of silicon cores were placed in a reaction furnace, and a polycrystalline silicon rod was grown according to a Siemens method. The average value D of the diameter after the deposition step of the polycrystalline silicon rod was set within the range from 150 to 300 mm. The mutual interval L (mm) between the multiple pairs of silicon cores was set by changing the mutual distance between center points each connecting two electrodes in which both the lower ends of the silicon cores were received. The reaction furnace had an inner diameter of 1.8 m and a height of 3 m, the concentration of a trichlorosilane gas as a raw material of polycrystalline silicon was 30% by volume, and the flow rate of a hydrogen gas for dilution was 100 Nm³/hour.

The evaluation results of the polycrystallinee silicon rod in each of Examples 1 to 9 and Comparative Examples 1 to 5 were summarized in Table 1 and Table 2. The description "Locally heterogeneous crystal" in the Tables refers to one confirmed as a locally heterogeneous portion having a grain size of 10 µm or more on an etched surface obtained in etching of the surface of a plate-like sample collected so that the direction vertical to the long axis direction of the polycrystalline silicon rod corresponded to the principal plane direction, by a mixed liquid of hydrofluoric acid and nitric acid.

TABLE 1

| | | | Comparative Example | | | Example | | | |
|---|---|---|---|---|---|---|---|---|---|
| | | | 1 | 2 | 3 | 1 | 2 | 3 | 4 |
| D/L | | | 0.90 | 0.69 | 0.42 | 0.40 | 0.36 | 0.25 | 0.11 |
| Reaction pressure (MPa) | | | | | | 0.45 | | | |
| Needle crystal | Position | Outside | Observed | Observed | Observed | Not observed | Not observed | Not observed | Not observed |
| | | R/2 | Observed | Observed | Observed | Not observed | Not observed | Not observed | Not observed |
| | | Center | Not observed | Not observed | Not observed | Not observed | Not observed | Not observed | Not observed |
| Locally heterogeneous crystal | Position | Outside | Observed | Observed | Observed | Not observed | Not observed | Not observed | Not observed |
| | | R/2 | Observed | Observed | Observed | Not observed | Not observed | Not observed | Not observed |
| | | Center | Observed | Observed | Not observed | Not observed | Not observed | Not observed | Not observed |
| Variation in diffraction intensity of <220> ($6\sigma_{n-1}$/Ave.) | Position | Outside | 1.08 | 1.10 | 0.58 | 0.54 | 0.40 | 0.20 | 0.10 |
| | | R/2 | 1.00 | 0.60 | 0.30 | 0.30 | 0.20 | 0.15 | 0.10 |
| | | Center | 0.40 | 0.20 | 0.15 | 0.12 | 0.10 | 0.09 | 0.08 |
| Surface temperature (° C.) | Position | Outside | 1091 | 1088 | 1085 | 1084 | 1082 | 1082 | 1081 |
| | | R/2 | 1055 | 1053 | 1051 | 1050 | 1048 | 1048 | 1048 |
| | | Center | 1030 | 1028 | 1025 | 1023 | 1021 | 1020 | 1020 |
| FZ crystal line disappearance | Observed or not observed | | Observed | Observed | Observed | Not observed | Not observed | Not observed | Not observed |

TABLE 2

|  |  | Comparative Example | | Example | | | | |
|---|---|---|---|---|---|---|---|---|
|  |  | 4 | 5 | 5 | 6 | 7 | 8 | 9 |
| D/L |  |  |  |  | 0.36 |  |  |  |
| Reaction pressure (MPa) |  | 0.05 | 0.1 | 0.2 | 0.3 | 0.45 | 0.6 | 0.9 |
| Locally heterogeneous crystal | Outside | Observed | Observed | Not observed | Not observed | Not observed | Not observed | Not observed |
|  | R/2 | Observed | Observed | Not observed | Not observed | Not observed | Not observed | Not observed |
|  | Center | Observed | Observed | Not observed | Not observed | Not observed | Not observed | Not observed |

The surface temperature shown in Table 1 is a value measured with a radiation thermometer at the center portion in the height direction, and is merely a reference value.

It was found from the results shown in Table 1 that the polycrystalline silicon rod in each of Examples 1 to 4 allowed the degree of variation in diffraction intensity from a <220> plane, in evaluation as the $6\sigma_{n-1}$/average value, to satisfy 0.15 or less in the center region, 0.30 or less in the R/2 region and 0.58 or less in the outer region, exhibited crystal homogeneity, and was not observed to cause any crystal line to disappear-even when used as a raw material for single-crystallization according to an FZ method.

In addition, as the D/L value was smaller, the degree of variation in diffraction intensity from a <220> plane was also lower. Specifically, the polycrystalline silicon rod in Example 2 allowed the degree of variation in diffraction intensity from a <220> plane to satisfy 0.12 or less in the center region, 0.30 or less in the R/2 region and 0.54 or less in the outer region, the polycrystalline silicon rod in Example 3 allowed the degree of variation in diffraction intensity from a <220> plane to satisfy 0.09 or less in the center region, 0.15 or less in the R/2 region and 0.20 or less in the outer region, and the polycrystalline silicon rod in Example 4 allowed the degree of variation in diffraction intensity from a <220> plane to satisfy 0.08 or less in the center region, 0.10 or less in the R/2 region and 0.10 or less in the outer region.

On the contrary, the polycrystalline silicon rod in each of Comparative Examples did not allow the degree of variation in diffraction intensity from a <220> plane, in evaluation as the $6\sigma_{n-1}$/average value, to satisfy the condition "0.15 or less in the center region, 0.30 or less in the R/2 region and 0.58 or less in the outer region", and was observed to cause any crystal line to disappear when used as a raw material for single-crystallization according to an FZ method.

It was found from the results shown in Table 2 that high crystal homogeneity was achieved when the reaction pressure in the deposition step of polycrystalline silicon was set to 0.2 MPa or more.

INDUSTRIAL APPLICABILITY

The present invention provides polycrystalline silicon suitable as a raw material for production of single-crystalline silicon, thereby resulting in contribution to stable production of single-crystalline silicon.

What is claimed is:

1. A method for producing a polycrystalline silicon rod having a diameter of 150 mm or more by a deposition according to a chemical vapor deposition process, wherein a D/L value is set within a range of less than 0.40 when at least two pairs of silicon cores are placed in a reaction furnace and wherein an average value of a final diameter of the polycrystalline silicon rod is defined as D (mm) and a mutual interval between the at least two pairs of silicon cores is defined as L (mm).

2. The method for producing a polycrystalline silicon rod according to claim 1, wherein a reaction pressure in the deposition according to the chemical vapor deposition process of the polycrystalline silicon is set to 0.2 MPa or more.

* * * * *